(12) United States Patent
Tsividis

(10) Patent No.: US 7,474,237 B2
(45) Date of Patent: Jan. 6, 2009

(54) CIRCUITS AND METHODS FOR USING ERROR CORRECTION IN POWER AMPLIFICATION AND SIGNAL CONVERSION

(75) Inventor: Yannis Tsividis, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 11/700,342

(22) Filed: Jan. 31, 2007

(65) Prior Publication Data

US 2007/0229332 A1 Oct. 4, 2007

Related U.S. Application Data

(60) Provisional application No. 60/765,053, filed on Feb. 3, 2006.

(51) Int. Cl.
*H03M 1/10* (2006.01)
*H03F 1/08* (2006.01)
(52) U.S. Cl. .................. 341/110; 341/118; 330/151

(58) Field of Classification Search ............... 341/110, 341/118, 120; 330/151
See application file for complete search history.

(56) References Cited

U.S. PATENT DOCUMENTS

| | | | |
|---|---|---|---|
| 4,107,669 A | 8/1978 | Tewksbury | |
| 4,580,105 A * | 4/1986 | Myer | 330/149 |
| 5,021,786 A | 6/1991 | Gerdes | |
| 5,124,706 A | 6/1992 | Gerdes | |
| 5,334,946 A * | 8/1994 | Kenington et al. | 330/144 |
| 6,097,324 A * | 8/2000 | Myer et al. | 341/118 |
| 6,271,724 B1 * | 8/2001 | Nefiling | 330/149 |
| 6,765,440 B2 * | 7/2004 | Chandrasekaran | 330/151 |
| 6,784,814 B1 | 8/2004 | Nair et al. | |
| 2005/0017802 A1* | 1/2005 | Robinson | 330/151 |

\* cited by examiner

*Primary Examiner*—Howard Williams
(74) *Attorney, Agent, or Firm*—Wilmer Cutler Pickering Hale and Dorr LLP

(57) ABSTRACT

Circuits and methods for using error correction in power amplification and signal conversion are disclosed herein. In some embodiments, methods for using error correction in power amplification and signal conversion including converting an input signal into a digital signal; amplifying and converting the digital signal to produce an amplified analog signal; adjusting the input signal to produce an adjusted signal; subtracting the amplified analog signal from the adjusted signal to produce a subtracted signal; and amplifying the subtracted signal to produce an error correction signal and adding the error correction signal to the amplified analog signal.

22 Claims, 4 Drawing Sheets

CIRCUITS AND METHODS FOR USING ERROR CORRECTION IN POWER AMPLIFICATION AND SIGNAL CONVERSION

CROSS-REFERENCE TO RELATED APPLICATIONS

This application is related to U.S. Provisional Application No. 60/765,053, entitled "Using the Remainder in A/D and D/A Conversion," filed Feb. 3, 2006, which is hereby incorporated by reference herein in its entirety.

TECHNOLOGICAL FIELD

The present application relates to circuits and methods for using error correction in power amplification and signal conversion.

BACKGROUND

Power amplifiers can be used in various applications from stereo systems to industrial motor control. The general purpose of a power amplifier is to take an input signal and make a signal suitable for driving a load, such as a loudspeaker. The power amplifier accomplishes this by increasing the strength of the input signal, which is typically measured in Watts. In a solid state power amplifier, transistors are used to increase current and/or voltage of the input signal and, as a result, increase the strength of the signal.

Solid state power amplifiers also exist as digital power amplifiers. Digital amplifiers involve using transistors as switches rather than current and voltage regulators as an analog amplifier would. Because of their switching approach, digital amplifiers are generally more power efficient than their analog counterparts over a similar amplification range. However, by using a digital power amplifier, an amount of quantization error typically results from digital-to-analog conversion following amplification. It is therefore desirable to have a more efficient power amplifier that can combine some of the efficiency of a digital power amplifier with a similar level of performance, in terms of absence of quantization noise, to an analog power amplifier.

SUMMARY

Circuits and methods for using error correction in power amplification and signal conversion are disclosed herein.

In some embodiments, methods for using error correction in power amplification and signal conversion include converting an input signal into a digital signal; amplifying and converting the digital signal to produce an amplified analog signal; adjusting the input signal to produce an adjusted signal; subtracting the amplified analog signal from the adjusted signal to produce a subtracted signal; and amplifying the subtracted signal to produce an error correction signal and adding the error correction signal to the amplified analog signal.

In some embodiments, circuits using error correction in power amplification and signal conversion include an analog-to-digital converter (ADC), a power digital-to-analog converter (DAC), a subtractor, a power amplifier, and a signal combiner. The ADC has an input and an output. The DAC has an input coupled to the output of the ADC and an output that produces a converted output. The subtractor compares a first input coupled to the converted output from the DAC to a second input coupled to the input of the ADC, and has an output. The power amplifier has an input coupled to the output of the subtractor, and an output that produces an error correction signal. The signal combiner is coupled to the output of the power amplifier and the output of the DAC, and combines the error correction signal with the converted output.

In some embodiments, circuits using error correction in power amplification and signal conversion include an analog-to-digital converter (ADC), a power digital-to-analog converter (DAC), a subtractor, and a signal combiner. The ADC has an input and an output. The DAC has an input coupled to the output of the ADC and an output that produces a converted output. The subtractor compares a first input coupled to the converted output from the DAC to a second input coupled to the input of the ADC, and has an output. The signal combiner is coupled to the output of the subtractor and the output of the DAC, and combines the error correction signal with the converted output.

In some embodiments, circuits using error correction in power amplification and signal conversion include means for analog-to-digital conversion, means for power digital-to-analog conversion, means for power amplification, means for comparing, and means for combining. The means for analog-to-digital conversion has an input and an output. The means for power digital-to-analog conversion has an input coupled to the output of the means for analog-to-digital conversion and an output that produces a converted output. The means for comparing a first input is coupled to the converted output from the means for power digital-to-analog conversion to a second input coupled to the input of the means for analog-to-digital conversion, and has an output. The means for power amplification has an input coupled to the output of the means for comparing, and an output that produces an error correction signal. The means for combining is coupled to the output of the means for power amplification and the output of the means for power digital-to-analog conversion, and combines the error correction signal with the converted output.

In some embodiments, circuits using error correction in power amplification and signal conversion include means for analog-to-digital conversion, means for power digital-to-analog conversion, means for comparing, and means for combining. The means for analog-to-digital conversion has an input and an output. The means for power digital-to-analog conversion has an input coupled to the output of the means for analog-to-digital conversion and an output that produces a converted output. The means for comparing a first input is coupled to the converted output from the means for power digital-to-analog conversion to a second input coupled to the input of the means for analog-to-digital conversion, and has an output. The means for combining is coupled to the output of the means for comparing and the output of the means for power digital-to-analog conversion, and combines the error correction signal with the converted output.

DETAILED DESCRIPTION

Circuits and methods for using error correction in power amplification and signal conversion are disclosed. The disclosed subject matter describes circuits and methods for combining digital power amplification and feed-forward error correction to improve output signal quality. While digital power amplification can be more power efficient than analog power amplification, digital power amplification suffers from quantization error and other switching noise in the output signal. The disclosed subject matter provides a subtraction signal to reduce the quantization error or noise when combined with the output signal. The subtraction signal is produced by adjusting the input signal and comparing the input signal to the output signal. Thus, the subtraction signal is a measure of the error in the output of the signal and can be used to subtract some or all of the error from the output of the power amplifier in some embodiments.

Figure 4:
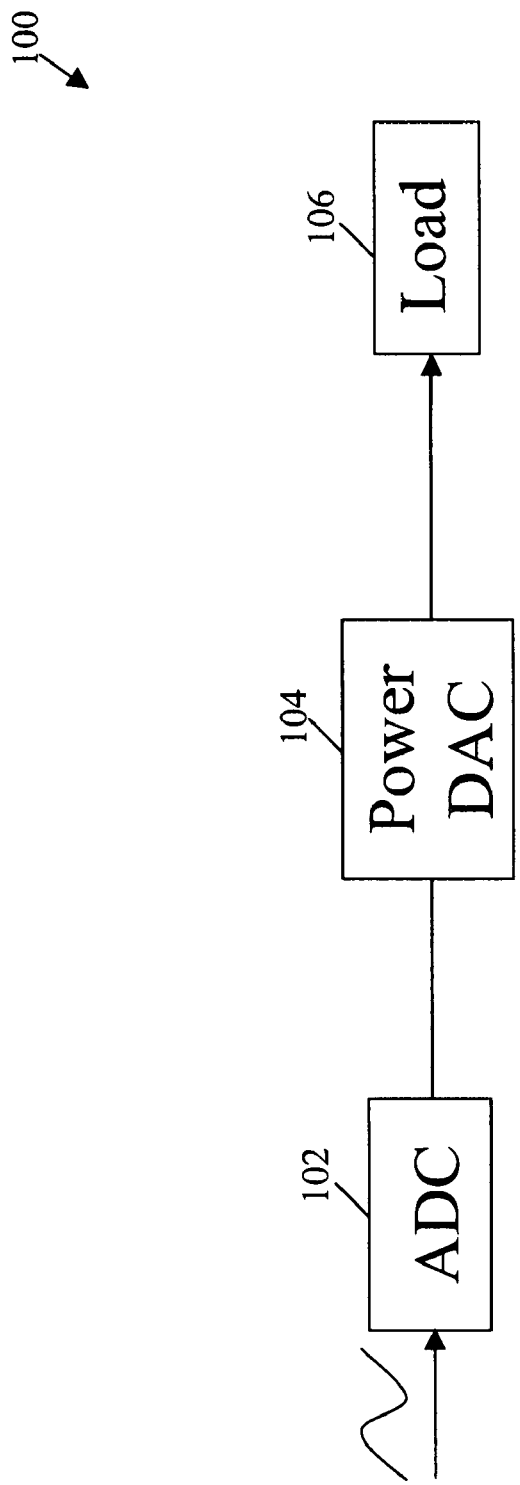
FIG. 4 illustrates a prior art circuit schematic of a power amplifier topology.

FIG. 4 illustrates a circuit schematic 100 of a power amplifier topology in accordance with the prior art. Circuit schematic 100 includes an analog-to-digital converter (ADC) 102, a power digital-to-analog converter (DAC) 104, and a load 106. ADC 102 produces a digital signal that is inputted to power DAC 104. Power DAC 104 can be a digital-to-analog converter and a digital power amplifier, possibly followed by a smoothing filter, that amplifies through a switching approach. The output signal is inputted into load 106.

Generally, analog-to-digital conversion and digital-to-analog conversion results in quantization error. Quantization error arises because information is lost when an analog signal is converted into a digital signal. The information is lost because an analog-to-digital converter (e.g., ADC 102) compares the input signal to a finite number of references in order to produce a digital signal. Typically, quantization error is reduced in the prior art by introducing more quantization levels and/or by filtering. The former increases the resolution of the ADC's and the DAC's output signal, while the latter smoothes transitions.

If quantization error is not reduced or removed, quality and performance degradation may be problematic. In audio systems, for example, quantization error adds unwanted noise and distortion that may harm sound quality.

Known approaches to reducing quantization error have had limited success. For example, it may be costly and technically difficult to increase the number of quantization levels in the ADC and DAC of such circuits. As another example, matching a filter that suitably reduces quantization to more than one type of load can be difficult.

Figure 1:
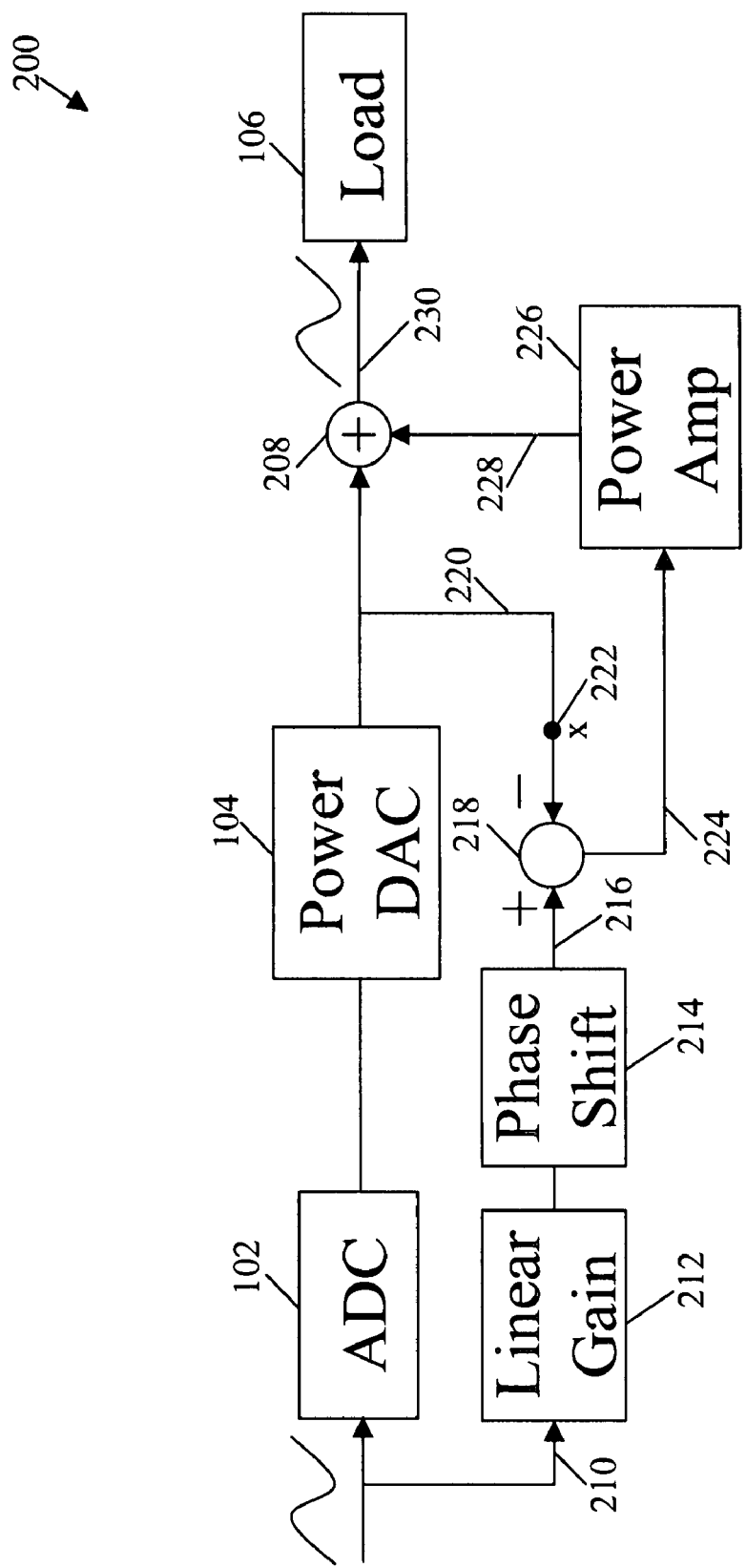
FIG. 1 illustrates a circuit schematic of a power amplifier topology with feed-forward error correction in accordance with some embodiments of the disclosed subject matter.

FIG. 1 illustrates a circuit schematic 200 of a power amplifier topology with feed-forward error correction in accordance with some embodiments of the disclosed subject matter. The feed-forward circuit schematic 200 includes analog-to-digital converter (ADC) 102, power digital-to-analog converter (DAC) 104 (which can include an output filter), load 106, a signal combiner 208, an input signal 210, a linear gain element 212, a phase shifter 214, an adjusted signal 216, a subtractor 218, an output signal 220, an error signal 224, an analog power amplifier 226, an error correction signal signal 228, and a drive output 230. In some embodiments, signal combiner 208 can be a summing device or a power combiner.

In operation, the feed-forward error correction of FIG. 1 determines the difference between output signal 220 and adjusted signal 216 and uses the difference between the two signals to adjust drive output 230. To ensure subtractor 218 receives comparable signals, linear gain element 212, which can include a sign inversion if needed, and phase shifter 214 can be used to adjust signal 216 to compensate for gain and phase changes introduced by ADC 102 and by power DAC 104. ADC 102 and power DAC 104 may introduce gain changes to input signal 210 that are greater than 1, so linear gain element 212 can be used to amplify input signal 210 by an amount comparable to that introduced by ADC 102 and power DAC 104, the latter possibly including a filter. Linear gain element 212 and phase shifter 214 can introduce gain and phase changes that can be a function of frequency. This may be desirable because gain and phase changes introduced by ADC 102 and power DAC 104 can be frequency dependent. In some embodiments, a linear gain element can additionally or alternatively be placed at position x 222 to match the signal level at the input to subtractor 218. Alternatively, the subtractor can perform these scaling functions. In some embodiments, linear gain element at position x 222 can be implemented with a voltage divider (e.g., the voltage divider can be implemented with variable resistors, or with transistors acting as variable gain elements that can be tuned to adjust a gain reduction in output signal 220).

Figure 2:
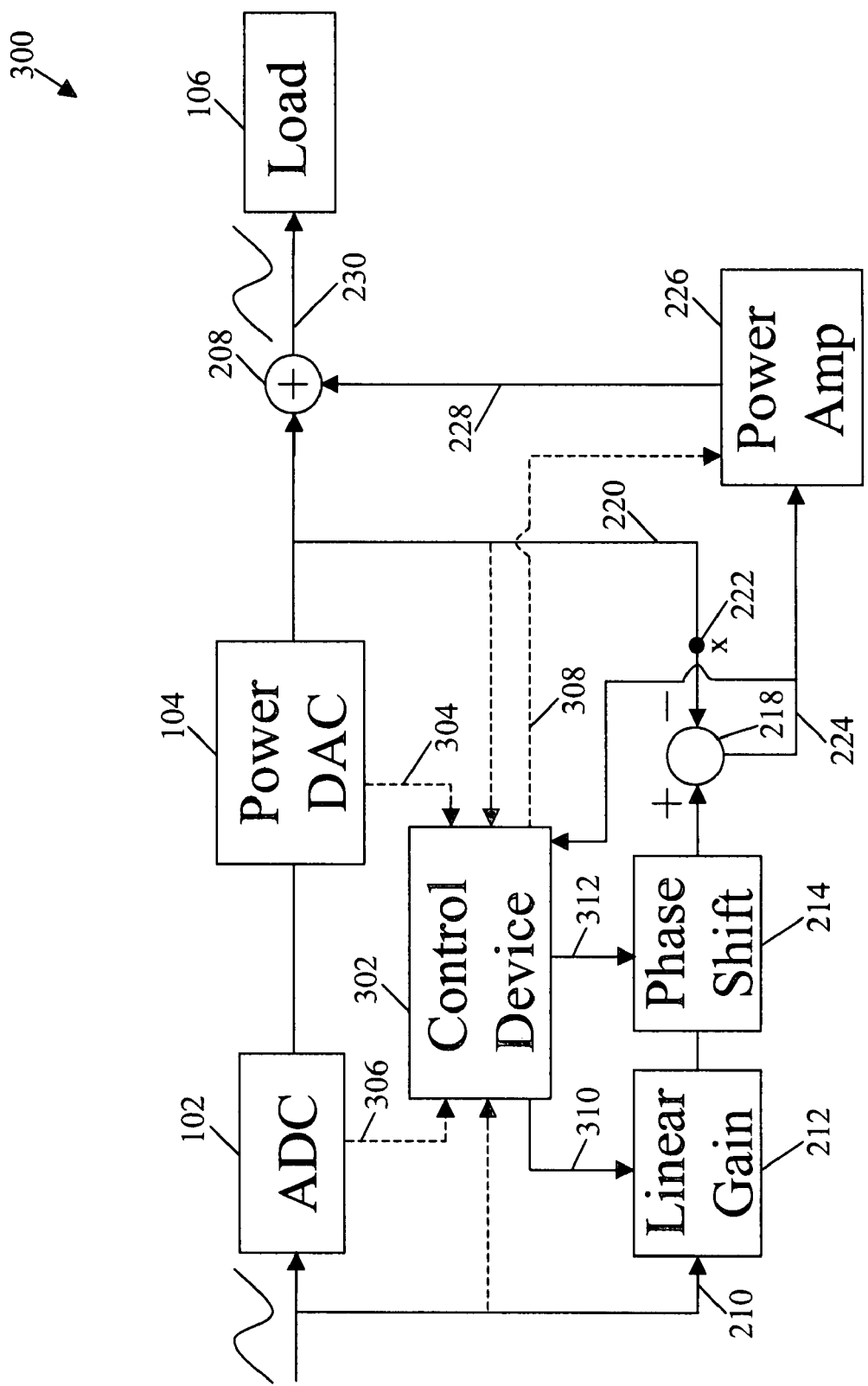
FIG. 2 illustrates a circuit schematic of a power amplifier with an automatic controller in accordance with some embodiments of the disclosed subject matter.

Gain and phase changes can be automatically adjusted in some embodiments of the disclosed subject matter, as shown in FIG. 2, by using a control device 302 that can modify linear gain element 212, phase shifter 214, and the power amp 226 (in some embodiments) to track changes in circuit 300 based on the subtractor output signal 224, and possibly on auxiliary signals (in some embodiments) such as input signal 210, DAC signal 304, ADC signal 306, and output signal 220. DAC signal 304 and ADC signal 306 can be used to carry gain and phase information to control device 302.

The automatic adjustment can be used to modify linear gain element 212 and/or phase shifter 214 when an amplification and/or a phase change is made in ADC 102 or power DAC 104. Additionally, when heat, component tolerance, or other environmental variables cause changes in the operation of the circuit, control device can modify linear gain element 212, phase shifter 214, and power amp 226 to reduce any effects of the above-mentioned variables.

Control device 302 can adjust tuning signal 308, gain adjustment signal 310, and phase adjustment signal 312 according to an algorithm or instruction set based on subtractor output 224, input signal 210, output signal 220, DAC signal 304, and ADC signal 306 that control device 302 receives. In some embodiments, subtractor output 224, input signal 210 and output signal 220 can be the signals used by control device 302 to adjust tuning signal 308, gain adjustment signal 310, and phase adjustment signal 312. In other embodiments, subtractor output 224 can be the only signal used by control device 302 to perform the above adjustments. In some embodiments, adjustment of tuning signal 308 may not be needed.

In one embodiment, the control device auxiliary inputs 210, 220, 306, and 304, and the auxiliary output 308 may be unused, and the control device 302 can use one input 224 and two outputs 310 and 312. In this embodiment, the control device adjusts the linear gain and the phase shifter until subtractor output 224 has minimum average power. This means that output signal 220 matches a replica of input 210 (properly scaled and phase shifted) to within a minimum error power, and the resulting error (i.e., the component missing from output 222 in order to reduce and/or remove error) is added to the output via power amplifier 226. Control device 302 can be implemented using dedicated hardware, a programmable logic device, a microchip running software, or any other suitable means.

Based on the gain elements, subtractor 218 produces quantization error 224. Quantization error 224 is fed to analog power amplifier 226 to create a proper quantization error signal 228 that can be combined with output signal 220. Once quantization error 224 is amplified by power amp 226, error correction signal signal 228 is combined with signal output 220 by signal combiner 208 to reduce quantization error present in drive output 230. When tuned, drive output 230 is an amplified version of input signal 210, with little or no quantization error. Drive output 230 is inputted to load 106, which can be a loudspeaker, a motor, or any other suitable device.

Figure 3:
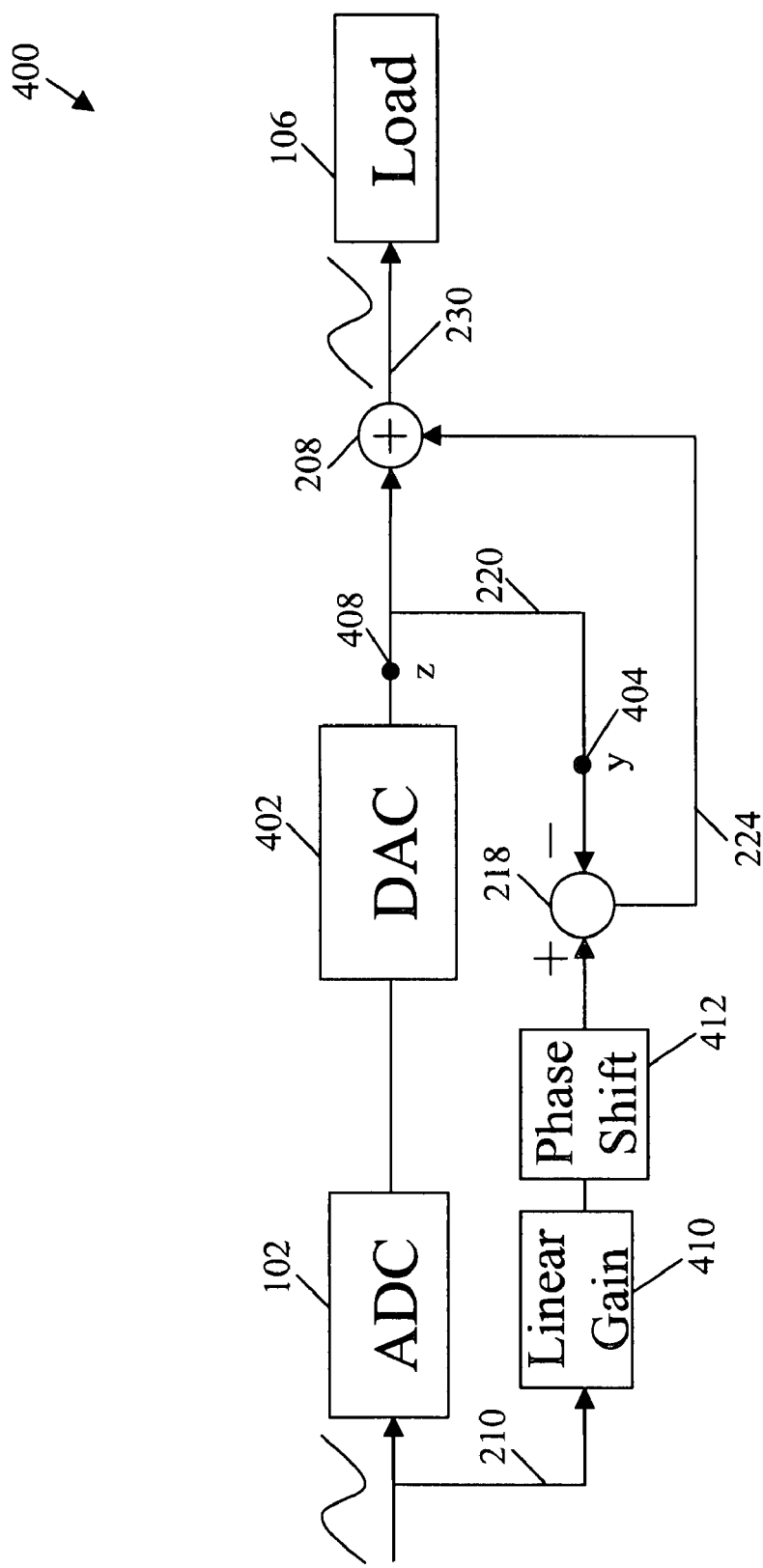
FIG. 3 illustrates a circuit schematic of an analog-to-digital and digital-to-analog topology that utilizes another feed-forward error correction method in accordance with some embodiments of the disclosed subject matter.

In some embodiments of the disclosed subject matter, ADC 102 of FIGS. 1 through 3, can be a sigma-delta converter which uses feedback and oversampling of the input signal with a one-bit comparator.

FIG. 3 illustrates a circuit schematic 400 of an analog-to-digital and digital-to-analog topology that utilizes another feed-forward error correction method in accordance with the disclosed subject matter. Circuit schematic 400 includes a digital-to-analog converter 402. In some embodiments, in addition to performing digital-to-analog conversion, DAC 402 can perform scaling or other functions. A linear gain 410 and a phase shifter 412 receive input signal 210, and can be used to adjust the gain and phase of input signal 210 in a similar fashion to linear gain 212 and phase shifter 214 of FIG. 1. In some embodiments, linear gain 410 and phase shifter 412 can be placed additionally or alternatively at position y 404. The linear gain (or attenuation), if added at position y 404, is used to account for signal modifications at DAC 402, which can have a gain that is not unity. Further, automatic adjustment of linear gain 212 and/or a phase shifter 214 can be used as shown in FIG. 2. A smoothing filter can be included after DAC 402 at position z 408 in some embodiments.

In some embodiments, ADC 102, DAC 104, and/or DAC 402 of FIGS. 1 though 3 can operate in continuous-time as described in US Publication No. US 2004/0263375, which is hereby incorporated by reference herein in its entirety.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed is:

1. A method for using error correction in power amplification and signal conversion comprising:
    converting an analog input signal into a digital signal;
    amplifying and converting the digital signal to produce an amplified analog signal;
    subtracting the amplified analog signal from the analog input signal to produce a subtracted signal; and
    amplifying the subtracted signal to produce an error correction signal and adding the error correction signal to the amplified analog signal.

2. The method of claim 1, further comprising introducing a linear gain and a phase shift to the analog input signal prior to subtracting the amplified analog signal from the analog input signal to produce a subtracted signal.

3. The method of claim 1, further comprising using a control device to determine adjustments to the input signal.

4. A circuit using error correction in power amplification and signal conversion comprising:
    an analog-to-digital converter (ADC) having an input and an output;
    a power digital-to-analog converter (DAC) having an input coupled to the output of the ADC and an output that produces a converted output;
    a subtractor that compares a first analog input coupled to the converted output from the DAC to a second analog input coupled to the input of the ADC, and that has an output;
    a power amplifier having an input coupled to the output of the subtractor, and an output that produces an error correction signal; and
    a signal combiner coupled to the output of the power amplifier and the output of the DAC, wherein the signal combiner combines the error correction signal with the converted output.

5. The circuit of claim 4, wherein the ADC is a sigma-delta converter.

6. The circuit of claim 4, wherein the ADC is a continuous-time ADC.

7. The circuit of claim 4, wherein the DAC includes a digital power amplifier and a digital-to-analog converter.

8. The circuit of claim 4, further comprising a gain element and a phase shifter coupled between the input to the ADC and the second input to the subtractor.

9. The circuit of claim 8, further comprising a control device that automatically adjusts the gain element and the phase shifter.

10. The circuit of claim 8, wherein the gain element and the phase shifter introduce gain and phase changes that are a function of frequency.

11. The circuit of claim 4, further comprising a smoothing filter coupled at the output of the DAC.

12. A circuit using error correction in power amplification and signal conversion comprising:
    an analog-to-digital converter (ADC) having an input and an output;
    a digital-to-analog converter (DAC) having an input coupled to the output of the ADC and an output that produces a converted output;
    a subtractor that compares a first analog input coupled to the converted output from the DAC to a second analog input coupled to the input of the ADC, and has an output providing an error correction signal;
    a signal combiner coupled to the output of the subtractor and the output of the DAC, wherein the signal combiner combines the error correction signal with the converted output.

13. The circuit of claim 12, wherein the ADC is a sigma-delta converter.

14. The circuit of claim 12, wherein the ADC is a continuous-time ADC.

15. The circuit of claim 12, further comprising a gain element and a phase shifter coupled between the input to the ADC and the second input to the subtractor.

16. The circuit of claim 15, further comprising a control device that automatically adjusts the gain element and the phase shifter.

17. The circuit of claim 12, further comprising a smoothing filter coupled at the output of the DAC.

18. A circuit using error correction in power amplification and signal conversion comprising:
    means for analog-to-digital conversion having an input and an output;
    means for power digital-to-analog conversion having an input coupled to the output of the means for analog-to-digital conversion and an output that produces a converted output;

means for comparing a first analog input coupled to the converted output from the means for power digital-to-analog conversion to a second analog input coupled to the input of the means for analog-to-digital conversion, and that has an output;

means for power amplification having an input coupled to the output of the means for comparing, and an output that produces an error correction signal; and means for combining coupled to the output of the means for power amplification and the output of the means for power digital-to-analog conversion, wherein the means for combining combines the error correction signal with the converted output.

19. The circuit of claim 18, further comprising means for providing gain and means for shifting phase coupled between the input to the means for analog-to-digital conversion and the second input to the means for comparing.

20. The circuit of claim 19, further comprising means for controlling that automatically adjusts the means for providing gain and means for shifting phase.

21. A circuit using error correction in power amplification and signal conversion comprising:

means for analog-to-digital conversion having an input and an output;

means for power digital-to-analog conversion having an input coupled to the output of the means for analog-to-digital conversion and an output that produces a converted output;

means for comparing a first analog input coupled to the converted output from the means for power digital-to-analog conversion to a second analog input coupled to the input of the means for analog-to-digital conversion, and has an output providing an error correction signal;

means for combining coupled to the output of the means for comparing and the output of the means for power digital-to-analog conversion, wherein the means for combining combines the error correction signal with the converted output.

22. The circuit of claim 21, further comprising:

means for providing gain and means for shifting phase coupled between the input to the means for analog-to-digital conversion and the second input to the means for comparing; and means for controlling that automatically adjusts the means for providing gain and means for shifting phase.

* * * * *